United States Patent
Kobayashi et al.

(10) Patent No.: US 6,537,621 B1
(45) Date of Patent: *Mar. 25, 2003

(54) METHOD OF FORMING A TITANIUM FILM AND A BARRIER FILM ON A SURFACE OF A SUBSTRATE THROUGH LAMINATION

(75) Inventors: Yasuo Kobayashi, Nirasaki (JP); Kunihiro Tada, Nirasaki (JP); Hideki Yoshikawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/473,715

(22) Filed: Dec. 29, 1999

Related U.S. Application Data

(63) Continuation-in-part of application No. 08/941,272, filed on Sep. 30, 1997, now Pat. No. 6,051,281.

(30) Foreign Application Priority Data

Oct. 1, 1996 (JP) .............................................. 8-280036

(51) Int. Cl.⁷ ............................................... C23C 16/34
(52) U.S. Cl. ...................... 427/535; 427/576; 427/253; 427/255.26; 427/255.4; 427/255.7; 438/627; 438/643; 438/648; 438/653; 438/656
(58) Field of Search .................................. 427/535, 576, 427/253, 255.26, 255.4, 255.7; 438/627, 643, 648, 653, 656; 148/237, 238, 669

(56) References Cited

U.S. PATENT DOCUMENTS

| | | |
|---|---|---|
| 5,173,327 A | 12/1992 | Sandhu et al. |
| 5,279,857 A | 1/1994 | Eichman et al. |
| 5,308,655 A | 5/1994 | Eichman et al. |
| 5,593,511 A | 1/1997 | Foster et al. |
| 5,975,912 A | 11/1999 | Hillman et al. |
| 6,051,281 A * | 4/2000 | Kobayashi et al. ......... 427/253 |

FOREIGN PATENT DOCUMENTS

| | | |
|---|---|---|
| GB | 2 299 345 | 10/1996 |
| JP | 62-32610 | 12/1987 |
| JP | 4-71231 | 5/1992 |
| JP | 6-510089 | 10/1994 |
| JP | 10-209077 | 8/1998 |
| WO | WO 93/04214 | 3/1993 |
| WO | WO 95/33865 | 12/1995 |

OTHER PUBLICATIONS

Matsumoto et al., Journal of the Less Common Metals, 84, (1982) pp. 157–163 (no month available).*

Copy of Korean Official Action mailed Nov. 30, 2001 in JP 1997–0049951 (a counterpart application) filed in Korea (with English Translation).

* cited by examiner

*Primary Examiner*—Timothy Meeks
(74) *Attorney, Agent, or Firm*—Oblon, Spivak, McClelland, Maier & Neustadt, P.C.

(57) ABSTRACT

A method for forming a titanium film and a titanium nitride film on a surface of a substrate by lamination, by which contamination of the substrate due to the by-product is suppressed and the contact resistance of the titanium film is reduced. The method comprises the steps of forming a titanium film on the surface of the substrate using a first process gas containing $TiCl_4$ and a reducing gas, subjecting the substrate to a plasma process using a second process gas containing $N_2$ gas and a reducing gas, thereby decreasing Cl in the titanium film and nitriding the surface of the titanium film to form a nitride layer, and forming a barrier metal (e.g., a titanium nitride film) on the titanium film having the nitride layer. Thus, the titanium film and the titanium nitride film are formed on the substrate by lamination. The second process gas contains $N_2$ gas in a ratio of 0.5 or lower with respect to the reducing gas.

20 Claims, 6 Drawing Sheets

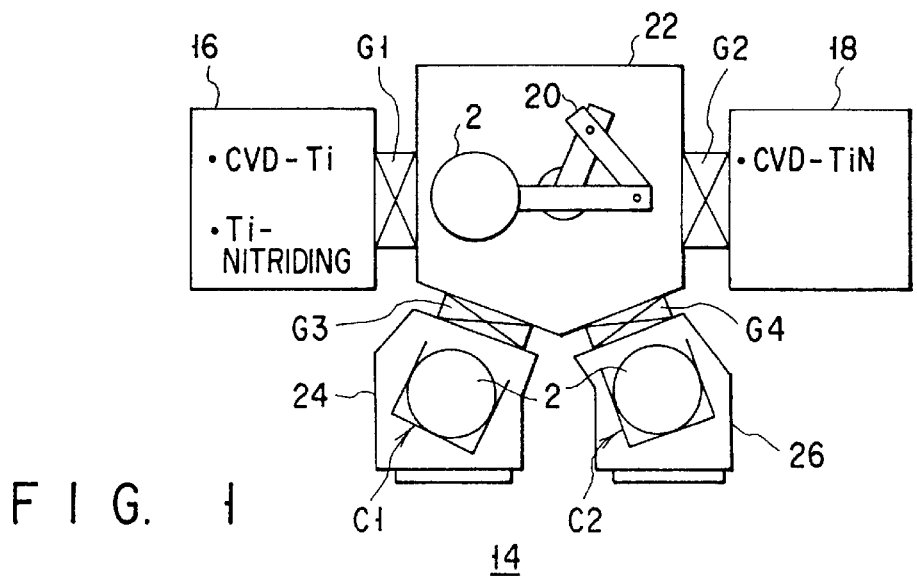
F I G. 1
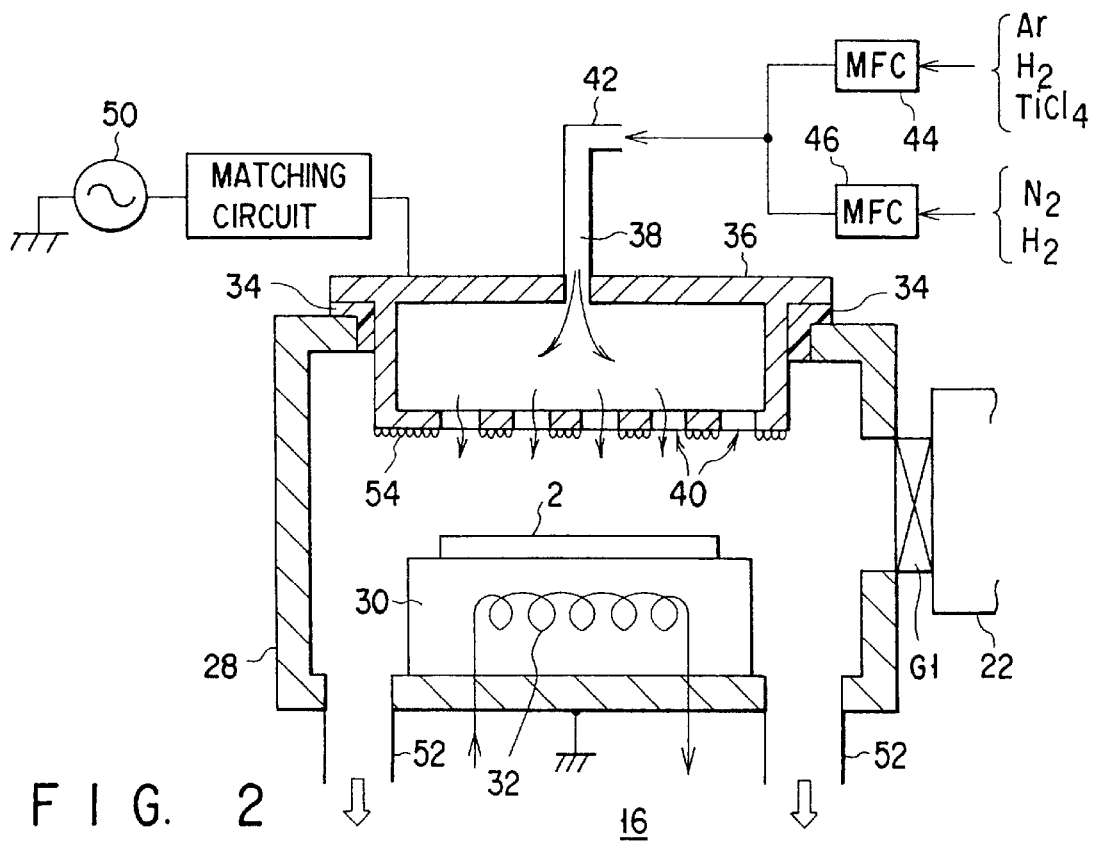
F I G. 2

METHOD OF FORMING A TITANIUM FILM AND A BARRIER FILM ON A SURFACE OF A SUBSTRATE THROUGH LAMINATION

CROSS-REFERENCE TO RELATED APPLICATIONS

This is a Continuation-in-Part application of U.S. patent application Ser. No. 08/941,272, filed Sep. 30, 1997 now U.S. Pat. No. 6,051,281, the entire contents of which are incorporated herein by reference.

BACKGROUND OF THE INVENTION

The present invention relates to a method of forming a titanium film and a barrier film on a surface of a substrate through lamination. In the present invention, a substrate (e.g., a silicon substrate) on a surface of which a titanium film and a barrier film need to be formed is the object of the processing. Typically, the present invention relates to a method of forming, through lamination, a titanium film and a barrier film on a surface of a semiconductor substrate formed of a silicon substrate in which contact holes and/or via holes are formed.

Forming a titanium film and a barrier film on a surface of a substrate through lamination is, for example, required for realizing the ohmic electrical connection with the surface of the substrate.

For example, in the field of recent semiconductor devices, the high density and the high integration have been required. In order to cope with this requirement, it is implemented that the multilayer metallization structure is formed on the silicon substrate. In this multilayer metallization structure, contact holes are formed in order to connect electrically therethrough a device of the lower layer and an aluminium wiring of the upper layer with each other. In addition, via holes are formed in order to connect electrically the aluminium wiring of the lower layer and the aluminium wiring of the upper layer with each other. Then, in order to realize the electrical connection therebetween through the holes, the holes are filled with filling metal such as aluminium, aluminium alloy or tungsten alloy. If the filling metal comes in direct contact with the silicon substrate or the aluminium wiring, then this will exert a bad influence (e.g., destruction of the diffused layers, and the like) on the silicon substrate or the multilayer metallization structure. The influence results from the phenomenon such as the suction effect (diffusion effect) between the silicon substrate or the multilayer metallization structure and the filling metal, and the like. This phenomenon is especially unpreferable in the current semiconductor device for which both the power saving and high speed operation are required. On the other hand, in the process in which tungsten alloy is employed as filling metal, $WF_6$ is used as one of the process gases. $WF_6$ penetrates into the silicon substrate to degrade its electrical characteristics and the like. This phenomenon is also unpreferable. In order to prevent these phenomena, before the contact holes, the via holes and the like are filled with a filling metal, the barrier layer is formed thinly so as to cover the sides of these holes and/or their peripheral areas. This barrier layer may be made of titanium nitride (TiN).

Now, the description will hereinbelow be given with respect to the structure in which the barrier layer is formed in the contact hole with reference to FIG. 5. In FIG. 5, the reference metal, 2 designates a silicon substrate as a semiconductor substrate which is for example a P type substrate. The reference numeral 4 designates a diffused layer of an n⁺ type for example which is formed in a part of the upper surface of the substrate 2, and the reference numeral 8 designates a contact hole which is formed by etching selectively away a part of an insulating layer 6 made of $SiO_2$ or the like. In this connection, a bottom layer 10 within the contact hole 8 is formed of a titanium film which is formed in order to come in ohmic contact with the diffused layer 4. This titanium film may be formed by utilizing the CVD (Chemical Vaper Deposition) or PVD (Physical Vaper Deposition) method. 12 designates a barrier film, made of titanium nitride, which is formed so as to cover the inner surface of the contact hole 8 and its peripheral area. After forming this barrier film, the contact hole 8 is filled with metal such as aluminium alloy. The above-mentioned barrier film serves to prevent the silicon substrate or the multilayer metallization structure from coming directly in contact with the filling metal, thereby suppressing the occurrence of the above-mentioned phenomena such as the suction effect (diffusion effect) and the like.

When the process of forming the titanium film has been completed, the process of forming the barrier film is carried out to form the structure in which the barrier film is directly laminated on the titanium film as described above and, the phenomenon occurs in which the barrier film is peeled off from the titanium film. As for this cause, it can be considered that Ti crystal which is formed in the process of forming the titanium film reacts on the process gas (e.g., titanium tetrachloride ($TiCl_4$) gas) which is used in the process of interest so that Ti crystal is partially etched away and as a result the tightly contacting portion between Ti crystal and the substrate becomes slender to reduce the bonding strength between Ti crystal and the substrate. In addition, the phenomenon occurs in which the constituent components of the process gas (e.g., $TiCl_4$ gas) which is used in the process of forming the titanium film diffuse into the titanium film. Both the phenomenon in which the barrier film is peeled off from the titanium film and the phenomenon in which the constituent components of the process gas diffuse into the titanium film result in the electrical resistance of the lamination body consisting of the titanium film and the barrier film being increased.

In order to prevent these phenomena, after the process of forming the titanium film 10, the process of nitriding the surface layer of the titanium film to form thereon a nitride layer is carried out. By carrying out this process, the nitride layer 13 is formed on the surface of the titanium film. Then, the barrier film 12 formed of the above-mentioned titanium nitride film is formed on the nitride layer 13. Conventionally, the process of nitriding the surface layer of the titanium film to form thereon the nitride layer is carried out in such a way that the substrate 2 is annealed by being heated up to 800° C. for example using a lamp at the atmospheric pressure in $N_2$ ambient.

In this conventional process, the substrate is, after forming the titanium film 10, transferred to another reaction chamber for annealing. During this transfer, the substrate is subjected to the atmosphere so that a $TiO_2$ film and the like each having a high resistance value are inconveniently formed on the titanium film 10.

In order to prevent this phenomenon, there has been developed the method wherein the process of forming the titanium film 10 on the substrate and the process of nitriding the surface layer of the titanium film 10 to form thereon the nitride layer are continuously carried out in the same reaction chamber.

More specifically, the titanium film 10 is firstly formed on the substrate in the reaction chamber by utilizing the CVD method employing the process gas of the mixed gas consisting of titanium tetrachloride ($TiCl_4$) gas, $H_2$ gas and Ar gas. Then, the substrate 2 is subjected to plasma processing in an atmosphere of gas used to nitride the titanium (e.g., $NH_3$ gas) in the same reaction chamber in order to form the nitride layer 13 on the surface of the titanium film 10.

In this conventional method, since both the process of forming the titanium film 10 on the surface of the substrate 2 and the process of forming the nitride layer 13 on the surface of the titanium film are carried out in the same reaction chamber, it is prevented that the $TiO_2$ film as described above is formed, but a new problem occurs.

That is, when the titanium film 10 is being formed by utilizing the CVD method, the white or black complex (e.g., TiClx (x=2 to 3)) containing therein Ti by-product is adhered to the internal surface and the like of the reaction chamber. When completing the next process of nitriding the surface layer of the titanium film to form thereon the nitride layer in the same reaction chamber, that by-product comes off the internal surface of the reaction chamber down onto the substrate to contaminate the substrate. This is a problem.

In addition, in the above-mentioned conventional method, there arises the problem that the electrical resistance value of the titanium film is increased due to the phenomenon that the constituent components of the process gas (e.g., $TiCl_4$ gas) diffuse into the titanium film as described above.

BRIEF SUMMARY OF THE INVENTION

The present invention was made in order to solve the foregoing problems associated with the method wherein the titanium film and the barrier film are continuously formed, by lamination, on the surface of the substrate as described above through the continuous processes therefore.

It is therefore an object of the present invention to reduce the by-product which is adhered to the internal surface of the reaction chamber in the process of forming the titanium film on the substrate which come off from the internal surface of the reaction chamber down onto the substrate to contaminate the substrate.

It is another object of the present invention to reduce the electrical resistance value of the titanium film formed on the substrate.

Other objects of the present invention will be apparent from the following description.

According to a first aspect of the present invention, there is provided a method for forming a titanium film and a barrier film on a surface of a substrate by lamination, the method comprising the steps of: forming the titanium film on the surface of the substrate using a first process gas containing therein $TiCl_4$ and a reducing gas; forming plasma above a surface of the titanium film formed on the surface of the substrate using a second process gas containing therein $N_2$ gas and a reducing gas; decreasing Cl in the titanium film by decreasing $TiCl_4$ remaining in the titanium film and on the surface thereof by the reducing gas in the plasma, and simultaneously nitriding the surface of the titanium film by $N_2$ gas in the plasma; and forming the barrier film on the nitrided titanium film, the second process gas containing $N_2$ gas in a ratio of 0.5 or lower with respect to the reducing gas.

In the method, the reducing gas contained in the first process gas is preferably one of $H_2$ gas and $SiH_4$ gas.

Further, the reducing gas contained in the second process gas is preferably one of $H_2$ gas and $NH_3$ gas.

It is preferable that the step of forming the titanium film and the step of nitriding the surface of the titanium film be carried out by Chemical Vapor Deposition (CVD).

It is also preferable that the barrier film be a TiN film.

According to a second aspect of the present invention, there is provided a method for forming a titanium film and a barrier metal film on a surface of a substrate by lamination, the method comprising the steps of: forming plasma and the titanium film on the surface of the substrate using a process gas containing therein $TiCl_4$ and a reducing gas; decreasing $TiCl_4$ remaining in the titanium film and on the surface thereof by the reducing gas in the plasma, decreasing Cl in the titanium film and the surface thereof, and simultaneously nitriding the surface of the titanium film by $N_2$ gas in the plasma, the step being carried out under the conditions of an $H_2$ gas supply rate of 500 to 3000 sccm, an $N_2$ gas supply rate of 300 to 1000 sccm, a nitriding temperature of 550 to 800° C., a nitriding pressure of 0.5 to 10 Torr, and an RF power of 500W at 13.56 MHz; and forming the barrier film on the nitrided titanium film.

In the method, the step of decreasing $TiCl_4$ remaining in the titanium film and on the surface thereof by the reducing gas in the plasma, decreasing Cl from the titanium film and the surface thereof, and simultaneously nitriding the surface of the titanium film by $N_2$ gas in the plasma is preferably carried out under the conditions of an $H_2$ gas supply rate of 1500 sccm, an $N_2$ gas supply rate of 500 sccm, a nitriding temperature of 580 to 700° C., a nitriding pressure of 1 to 5 Torr, and an RF power of 500W at 13.56 MHz.

It is preferable that the step of decreasing $TiCl_4$ remaining in the titanium film and on the surface thereof by the reducing gas in the plasma, decreasing Cl in the titanium film and the surface thereof, and simultaneously nitriding the surface of the titanium film by $N_2$ gas in the plasma be carried out for 10 to 120 seconds.

Further, it is further preferable that the step of decreasing $TiCl_4$ remaining in the titanium film and on the surface thereof by the reducing gas in the plasma, decreasing Cl in the titanium film and the surface thereof, and simultaneously nitriding the surface of the titanium film by $N_2$ gas in the plasma be carried out for 30 to 60 seconds.

In the methods according to the first and second aspects, the substrate is preferably an Si wafer.

In the methods according to the first and second aspects, the step of decreasing $TiCl_4$ remaining in the titanium film and on the surface thereof by the reducing gas in the plasma, decreasing Cl in the titanium film and the surface thereof, and simultaneously nitriding the surface of the titanium film by $N_2$ gas in the plasma is preferably carried out at a pressure higher than that in the step of forming the titanium film.

In the methods according to the first and second aspects, the step of decreasing $TiCl_4$ remaining in the titanium film and on the surface thereof by the reducing gas in the plasma, decreasing Cl in the titanium film and the surface thereof, and simultaneously nitriding the surface of the titanium film by $N_2$ gas in the plasma is preferably carried out at a temperature higher than that in the step of forming the titanium film.

In the methods according to the first and second aspects, the titanium film formed on the surface of the substrate preferably has resistivity of 200 $\mu\Omega\cdot cm$.

According to a third aspect of the present invention, there is provided a method of forming a titanium film and a barrier film on a surface of a substrate by lamination, the method comprising the steps of:

forming titanium film on the surface of the substrate using process gas containing therein TiCl$_4$;

subjecting the substrate having the titanium film formed thereon to a plasma process using a second process gas containing therein both nitrogen gas and hydrogen gas, thereby nitriding a surface layer of the titanium film to form thereon a nitride layer; and forming a barrier film on the titanium film having the nitride layer formed thereon.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing a construction of a cluster tool system which is used to implement a method according to the present invention;

FIG. 2 is a cross sectional view showing a construction of a plasma processing system which is used to implement both the step of forming a titanium film and the step of nitriding a surface layer of the titanium film to form thereon a nitride layer;

DETAILED DESCRIPTION OF THE INVENTION

Figure 3A:
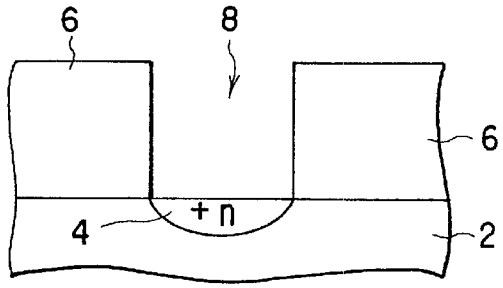
FIGS. 3A to 3E are respectively cross sectional views useful in explaining the steps of laminating and forming a titanium film, a nitride layer and a barrier film on a surface of a substrate according to the method of the present invention.
Figure 3B:
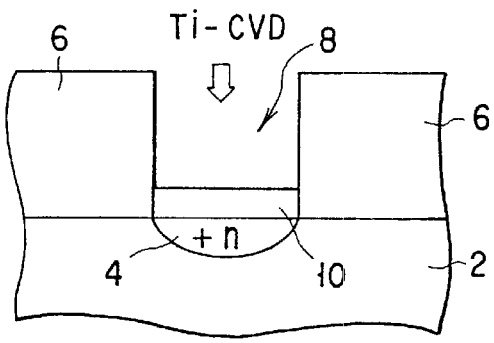
Figure 3C:
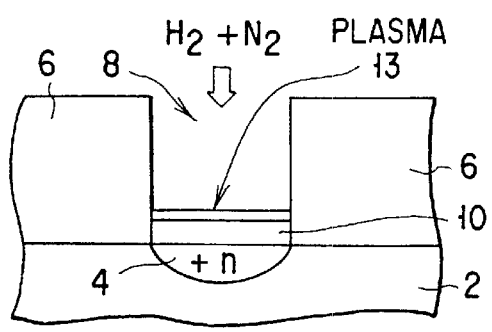
Figure 3D:
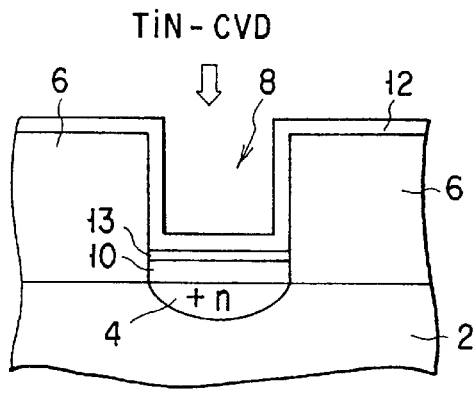

The present inventors found out a plurality of phenomena as will hereinafter be described as a result of making earnestly a study with respect to the conventional method of forming a titanium film and a barrier film on a surface of a substrate by lamination.

In the conventional method, when the titanium film 10 is being formed by utilizing the CVD method, the white or black complex (e.g., TiClx (x=2 to 3)) containing therein Ti which is called the by-product is produced to be adhered to the internal surface and the like of the reaction chamber. In the process of nitriding the surface layer of the titanium film to form thereon the nitride layer which process is continuously carried out in the same reaction chamber as in the process of forming the titanium film on the surface of the substrate, a large number of nitrogen (N) radicals each having the nitriding capability are generated. Then, the present inventors found out the phenomenon that the by-product is nitrided by the N radicals and come off the internal surface of the reaction chamber down onto the substrate. Then, as will hereinbelow be described in detail, the present inventors have developed the technique by which in the process of nitriding the surface layer of the titanium film to form thereon the nitride layer, hydrogen gas is contained as the reducing as in the process gas therefore, thereby reducing the phenomenon in which the by-product comes off as described above.

In addition, the phenomenon was found out that in the conventional method, when the titanium film 10 is being formed by utilizing the CVD method, the constituent components of the gas in the CVD diffuse into the titanium film 10 to increase the electrical resistance value of the titanium film. Then, the present inventors developed the technique by which in the next process of nitriding the surface layer of the titanium film to form thereon the nitride layer, hydrogen gas is contained as the reducing gas in the process gas therefore, thereby reducing that phenomenon to decrease the electrical resistance value of the titanium film.

The description will hereinafter be given with respect to a method of forming, by lamination, a titanium film and a barrier film on a surface of a substrate according to the present invention with reference to the accompanying drawings.

FIG. 1 shows a cluster tool system 14 which can implement the method of the present invention. The cluster tool system 14 includes a plasma thin film deposition system 16 which carries out continuously the process of forming a titanium film on a surface of Si substrate 2 as a substrate to be processed and the process of nitriding a surface layer of the titanium film to form thereon a nitride layer, and a thin film deposition system 18 which carries out, thereafter, the process of forming a titanium nitride film. Both the systems 16 and 18 are connected to a transfer chamber 22 through gate valves G1 and G2, respectively. A transfer arm 20 which is capable of bending and stretching as well as pivotating is provided in the inside of the transfer chamber 22. A first cassette chamber 24 and a second cassette chamber 26 are coupled to the transfer chamber 22 through gate valves G3 and G4, respectively. A cassette C1 which accommodates substrates 2 which are not still processed is provided in the first cassette chamber 24. On the other hand, a cassette C2 which accommodates substrates 2 which are already processed is provided in the second cassette 26. In the cluster tool system 14, the delivery of the substrate 2 is carried out by bending, stretching and pivoting the transfer arm 20.

The above-mentioned plasma thin film deposition system 16 will hereinbelow be described with reference to FIG. 2. This plasma thin film deposition system 16 has a cylindrical processing chamber 28 which is made of aluminium for example. A susceptor 30 for placing thereon the substrate 2 is installed in the inside of the processing chamber 28. Heating means (e.g., an electrical heater) 32 is provided inside the susceptor 30, and the substrate 2 which has been placed on the susceptor 30 is heated up to a predetermined temperature by the heating means 32. A shower head 36 is provided in the ceiling portion of the processing chamber 28 through an insulating member 34. The process gas which has been introduced to the inside of the shower head 36 through a gas feeding port 38 is supplied to the processing space of the processing chamber 28 through a large number of gas discharging ports 40 which are provided through the lower surface of the shower head 36. A gas supplying system 42 is connected to the gas feeding port 38. To the gas supplying system 42 are respectively connected a gas supplying system for supplying the process gas (e.g., Ar gas, $H_2$ gas and $TiCl_4$ gas) which is required when a titanium film is formed by utilizing the plasma CVD method, and a gas supplying system for supplying the process gas (e.g., $N_2$ gas and $H_2$ gas) which is required when the surface layer of the titanium film is nitrided. The supplying gas through the two gas supplying systems are controlled with their flow rates by mass flow controllers 44 and 46, respectively, to be supplied to the gas supplying system 42. Incidentally, in order to understand readily the processing process, the two gas supplying systems are separately described. In actual, however, the change may be made in such a way that $H_2$ gas common to both the two systems shares the independent one system, and so forth. When forming a titanium film, the shower head 36 serves as the upper electrode of the plasma thin film deposition system. For this reason, a high frequency power source 50 is connected to the shower head 36 through a matching circuit 48 so that the high frequency (e.g., 13.56 MHz) voltage used to generate plasma is supplied thereto. In addition, gas exhaust ports 52 are provided through the periphery of the bottom portion of the processing chamber 28. A vacuum pump (not shown) for exhausting the gas through the gas exhaust ports 52 to evacuate the inside of the processing chamber 28 is connected to each of the gas exhaust ports 52.

Next, the description will hereinafter be given with respect to the process of implementing the method of forming, by lamination, a titanium film, and a barrier film on a surface of a substrate according to the present invention using the above-mentioned cluster tool system 14 with reference to FIGS. 3A to 3E.

FIG. 3A shows the state in which a contact hole 8 is formed through an insulating layer 6 on the Si substrate 2 and also a diffused layer 4 is formed in the surface of the Si substrate 2. A large number of such unprocessed semiconductor substrates 2 are accommodated in the cassette Cl in the first cassette chamber 24. The unprocessed semiconductor substrate 2 is transferred into the transfer chamber 22 in an atmosphere of inactive gas (e.g., $N_2$ gas). After the gas valve G3 has been closed, the transfer chamber 22 is evacuated. Then, the gate valve G1 is opened and the unprocessed semiconductor substrate 2 is transferred to the plasma thin film deposition system 16 which is previously evacuated to be placed on the susceptor 30. Next, the process of forming a titanium film on the semiconductor substrate 2 is carried out within the plasma thin film deposition system 16. Then, the semiconductor substrate 2 is heated up to a predetermined process temperature (e.g., 580° C.) by the electrical heater 32. Under this condition, the process gas (e.g., Ar gas, $H_2$ gas and $TiCl_4$ gas) used to form a titanium film is introduced into the processing chamber 28 through the shower head 36, and the high frequency voltage is applied to the shower head 36 so that a titanium film is formed on the semiconductor substrate 2 by utilizing the plasma CVD method. The process pressure at this time is about 1,000 Torr, and a titanium film 10 is selectively deposited to the bottom portion of the contact hole 8 through which a diffused layer 4 is exposed to the outside (refer to FIG. 3B). The thickness of this titanium film 10 is about 20 nm for example. In the process of forming the titanium film, the undecomposed residual product (e.g., $TiCl_x$ (x=2 to 3)) is adhered as the by-product 54 to the underface of the shower head 36 especially. Since the processing environment during formation of the titanium film is not changed, the by-product 54 does not come off at all when forming the titanium film.

After the process of forming the titanium film has been completed, for the semiconductor substrate 2, the process of nitriding the surface layer of the titanium film to form thereon a nitride layer is carried out in the same processing chamber 28 as the process of forming the titanium film. That is, after the supply of the process gas used to form the titanium film has been stopped and then the gas in the processing chamber 28 is exhausted through the gas exhaust ports 52, the mixed gas of $N_2$ gas and $H_2$ gas is then supplied as the process gas for use in the process of nitriding the surface layer of the titanium film to form thereon a nitride layer into the processing chamber 28 through the shower head 36. Concurrently with this supply of mixed gas, the high frequency voltage of 13.56 MHz is applied from the high frequency power source 50 to the shower head 36 as the upper electrode so that plasma is produced. As a result, the surface layer of the titanium film 10 is nitrided to form thereon a titanium nitride layer 13 (refer to FIG. 3C). As for the processing conditions at this time, the supply rate of $N_2$ gas and the supply rate of $H_2$ gas are about 500 sccm and about 1,500 sccm, respectively, and the process pressure is about 1 Torr and also the process temperature is about 580° C. The flow rate of $N_2$ gas and the flow rate of $H_2$ gas may be suitably selected, respectively.

Although the process of nitriding the surface layer of the titanium film to form thereon the nitride layer may be carried out under the same conditions as those in the process of forming the titanium film as described above, it is preferable in order to attain the objects of the present invention that the process of nitriding the surface layer of the titanium film to form thereon the nitride layer is carried out at a temperature above 580° C., e.g., at a temperature equal to or higher than 580° C. but equal to or lower than the temperature at which the substrate is not destroyed.

In addition, in order to attain the objects of the present invention, the process of nitriding the surface layer of the titanium film to form thereon the nitride layer is preferably carried out at a process pressure equal to or higher than 1 Torr, e.g., at a process pressure of 5 Torr.

After the process of nitriding the surface layer of the titanium film to form thereon the nitride layer has been completed, the transfer arm 20 in the transfer chamber 22 transfers the semiconductor substrate 2 into the transfer chamber 22 which is maintained at a vacuum. Then, the transfer arm 20 moves the semiconductor substrate 2 into the plasma thin film deposition system 18 which is previously maintained at a vacuum. Within the plasma thin film deposition system 18, using the conventionally well known processing method, a titanium nitride film as a barrier film is formed on the surface of the titanium film having the nitride layer formed thereon by utilizing the CVD method (refer to FIG. 3D). Through this process, a titanium nitride film 12 as the barrier film is formed throughout the internal surface of the contact hole 8 and the upper surface of the insulating layer 6. As for the process gas for this process, for example, $TiCl_4$, $NH_3$, and $N_2$ may be employed. In addition, the process temperature is about 500° C., and the process pressure is about 350 mTorr.

Figure 3E:
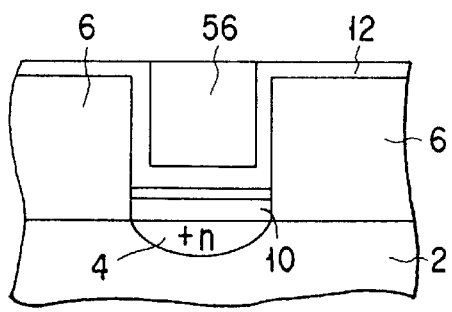

After the process of forming the titanium nitride film as the barrier film has been completed, the semiconductor substrate 2 is transferred from the thin film deposition system 18 and then is accommodated in the cassette C2 for accommodating the processed semiconductor substrate. Thereafter, as shown in FIG. 3E, the contact hole 8 is filled with an electrically conductive material 56 such as aluminium or aluminium alloy.

According to the method of the present invention, since the process of nitriding the surface layer of the titanium film 10 to form thereon the nitride layer is carried out using the mixed gas of $N_2$ gas and $H_2$ gas, it is possible to suppress greatly the by-product which has been formed during the process of forming the titanium film from coming off the internal surface of the chamber down onto the substrate.

In the conventional method wherein only $N_2$ gas or only $NH_3$ gas is used, the reaction expressed by the following Formula 1 takes place on the basis of the assistance of the nitrogen radicals each having the high nitriding capability.

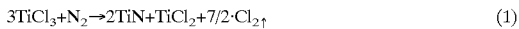

$$3TiCl_3 + N_2 \rightarrow 2TiN + TiCl_2 + 7/2 \cdot Cl_2 \uparrow \quad (1)$$

where $TiCl_3$ is one example of the by-product TiClx (x=2 to 3). $TiCl_2$ is a material having deliquescence, and TiN is a solid. The by-product remains in the form of the nonuniform mixed material of the material having deliquescence and the material having different hardness. Therefore, in the conventional method, the by-product easily comes off.

On the other hand, in the method of the present invention, the reaction expressed by the following Formula 2 takes place.

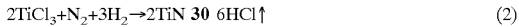

$$2TiCl_3 + N_2 + 3H_2 \rightarrow 2TiN\ 30\ 6HCl\uparrow \quad (2)$$

In the Formula 2, the by-product is almost changed into solid TiN, and hence the material which easily come off is not formed at all. For this reason, according to the present invention, it is possible to prevent greatly the by-product from coming off from the internal surface of the chamber down onto the substrate.

In actual, in accordance with the conventional method, and the method of the present invention, by carrying out repeatedly the process of forming the titanium film and the process of nitriding the surface layer of the titanium film to form thereon the nitride layer, how many substrates can be processed until the by-product comes off is experimented.

In the conventional method wherein $N_2$ gas is used in the process of nitriding the surface layer of the titanium film to form thereon the nitride layer, at a time when five sheets of semiconductor substrates have been processed, it is confirmed by visual observation that the by-product comes come off. On the other hand, in the method of the present invention, even when the fifty or more sheets of semiconductor substrates are processed, the peeling off of the by-product can not be confirmed at all. The process conditions of the experiments are as follows: The process pressure is 1 Torr, the RF power is 500W (13.56 MHz), the process temperature is 580° C., and the processing time is two minutes. With respect to the process gas, in the conventional method, $N_2$ gas is supplied at 1,000 sccm, while in the method of the present invention, $N_2$ gas is supplied at 500 sccm and $H_2$ gas is supplied at 1,500 sccm.

In addition, the mixed gas of $N_2$ gas and $H_2$ gas is used in such a way, whereby the contact resistance value of the titanium film can be greatly reduced. As for this cause, it is considered that $H_2$ gas reduces strongly $TiCl_4$ remaining in the titanium film to remove Cl therefrom, and also even when Cl is produced from the by-product. $H_2$ gas reduces Cl so that chlorine as the cause of increasing the resistance does not remain on the surface of the semiconductor substrate.

Figure 4:
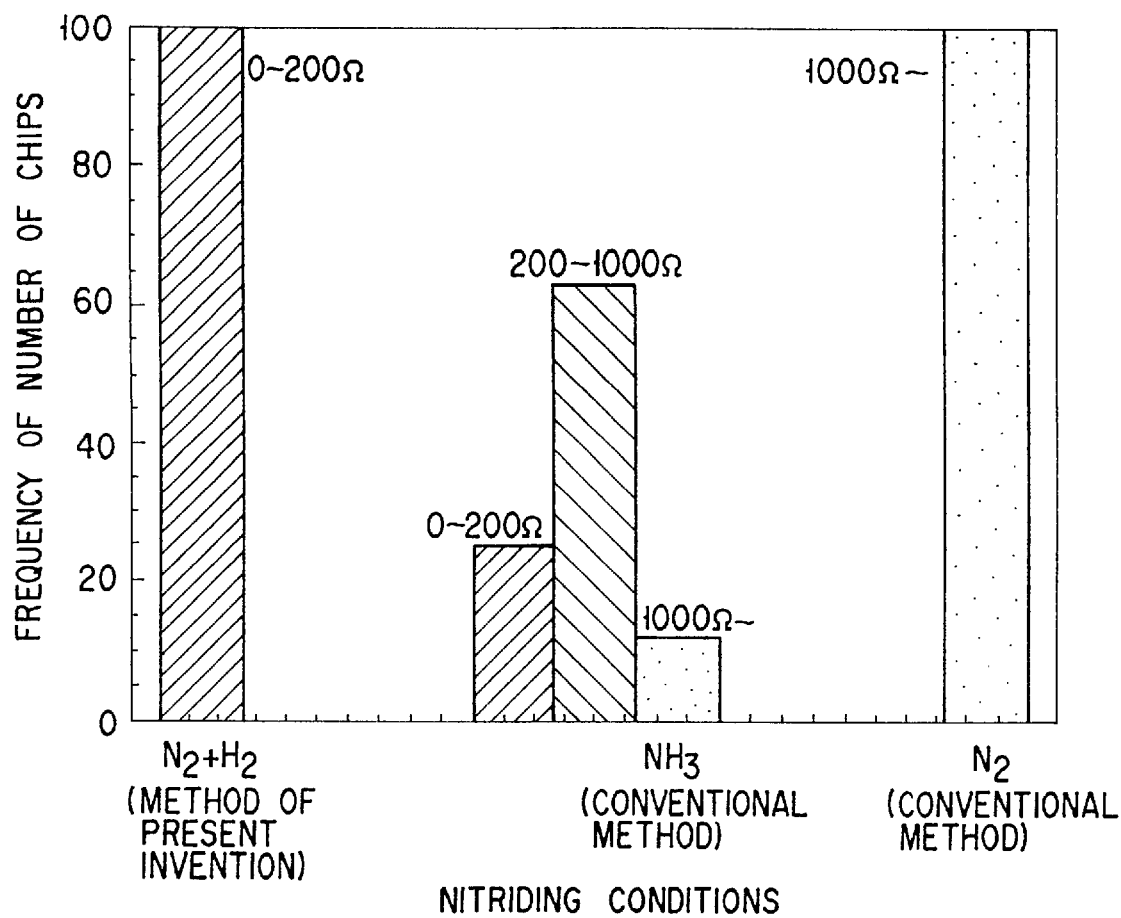
FIG. 4 is a graphical representation useful in explaining the comparison of contact resistance values in the substrate which are processed in accordance with the method of the present invention with contact resistance values in the substrate which are processed in accordance with the methods of the prior art.
Figure 5:
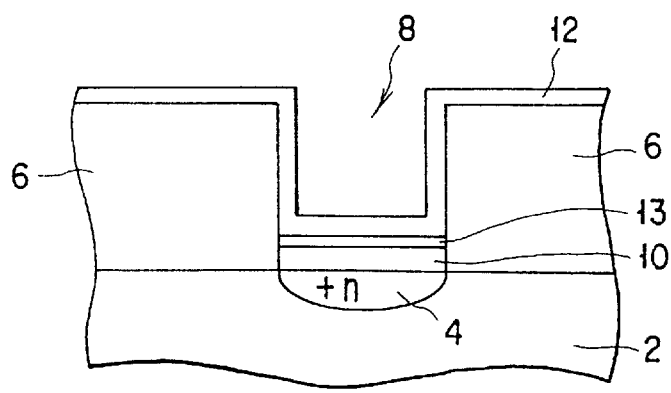
FIG. 5 is a cross sectional view useful in explaining the substrate on which a titanium film, a nitride layer and a titanium nitride film are continuously formed.

FIG. 4 shows the results of carrying out the process of nitriding the surface layer of the titanium film to form thereon the nitride layer in accordance with the method of the present invention as well as the conventional method. In this experiment, the process of nitriding the surface layer of the titanium film to form thereon the nitride layer is carried out using the semiconductor substrate in which a large number of contact holes each having 0.5 $\mu$m diameter in order to study the distribution situation of the contact resistance. In FIG. 4, the axis of ordinate represents the cumulative frequency of the number of chips. In the conventional method employing only $N_2$ gas, all the contact resistance are equal to or larger than 1,000Ω, and hence the characteristics are much worse than those in other cases. In the conventional method employing only $NH_3$ gas, some of the contact resistance are so small as to range from 0Ω to 200Ω, while some of the contact resistance are so high as to be equal to or larger than 1,000Ω. In such a way, the distribution of the contact resistance is considerably wide, and hence there is a problem in uniformity of the characteristics. On the other hand, in the case of the method of the present invention employing both $N_2$ gas and $H_2$ gas, the contact resistance are so small as to range from 0Ω to 200Ω, and hence the uniformity of the characteristics is ensured and the excellent results are shown.

The data shown in FIGS. 6 to 10 were obtained by a method for forming a titanium film and a barrier film on a surface of a substrate by lamination, the method comprising the steps of: forming the titanium film on the surface of the substrate using a first process gas containing therein $TiCl_4$ and a reducing gas ($H_2$ gas was used); forming plasma above a surface of the titanium film formed on the surface of the substrate using a second process gas containing therein $N_2$ gas and a reducing gas ($H_2$ gas was used); decreasing Cl in the titanium film by decreasing $TiCl_4$ remaining in the titanium film and on the surface thereof by the reducing gas in the plasma, and simultaneously nitriding the surface of the titanium film by the $N_2$ gas in the plasma; and forming the barrier film on the nitrided titanium film, the second process gas containing the $N_2$ gas in a ratio of 0.5 or lower with respect to the reducing gas.

Figure 6:
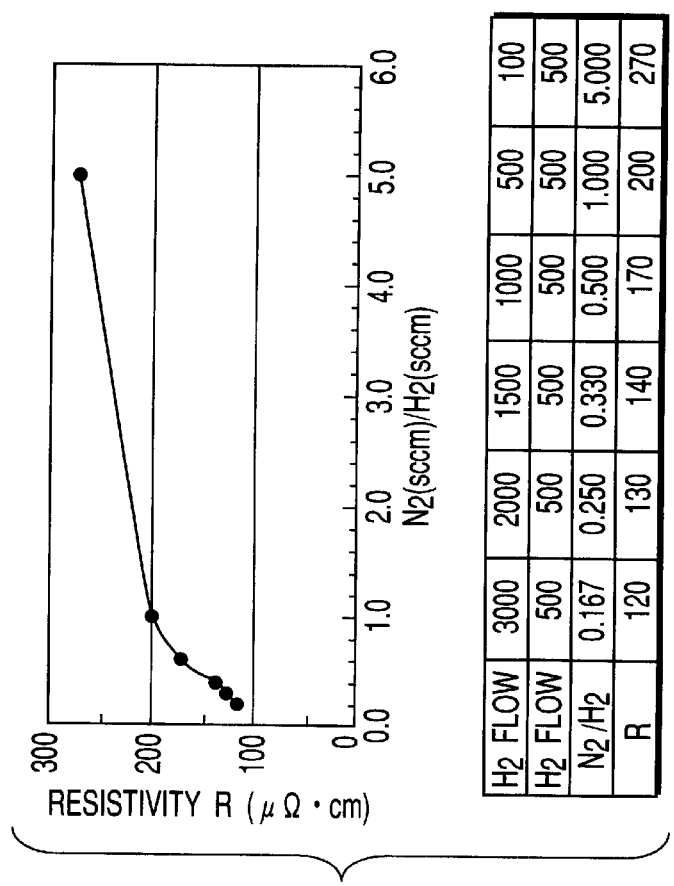
FIG. 6 is a diagram showing a change in resistivity relative to the value of N2/H2.

FIG. 6 is a diagram showing a change in resistivity as the ratio of $N_2$ to $H_2$ is changed. The data shown in the diagram were obtained from the experiments under the following conditions: the temperature of wafer is 600° C., the pressure is 1 Torr, and the process time is 30 seconds. As shown in FIG. 6, in the case where the ratio of $N_2$ gas to $H_2$ gas is 0.5 or lower, the rate of nitriding the surface of the titanium film is increased and the resistivity is considerably reduced.

Figure 7:
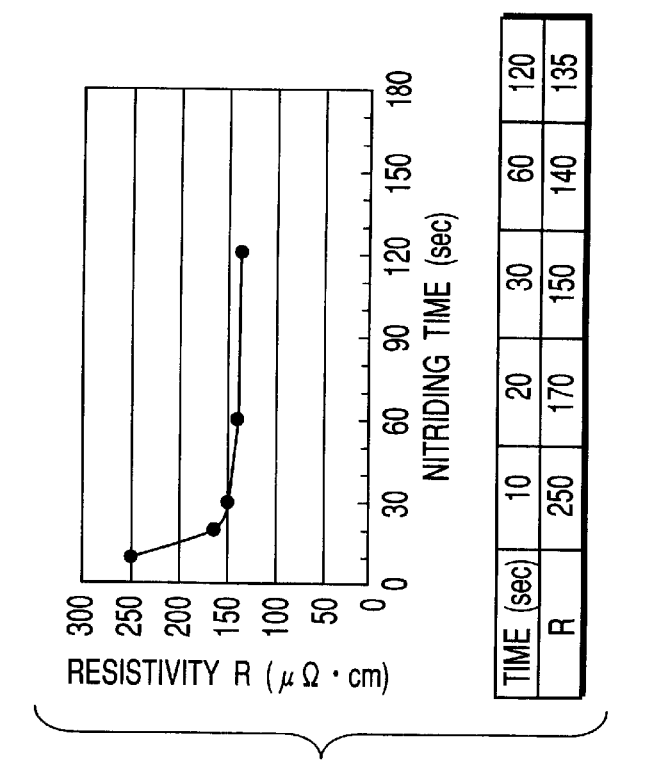
FIG. 7 is a diagram showing a change in resistivity relative to the nitriding time.

FIG. 7 is a diagram showing a change in resistivity relative to the nitriding time. AS shown in FIG. 7, in the case where the nitriding time is 10 to 120 seconds, preferably, 30 to 60 seconds, the rate of nitriding the surface of the titanium film is increased and the resistivity is considerably reduced.

Figures 8, 9:
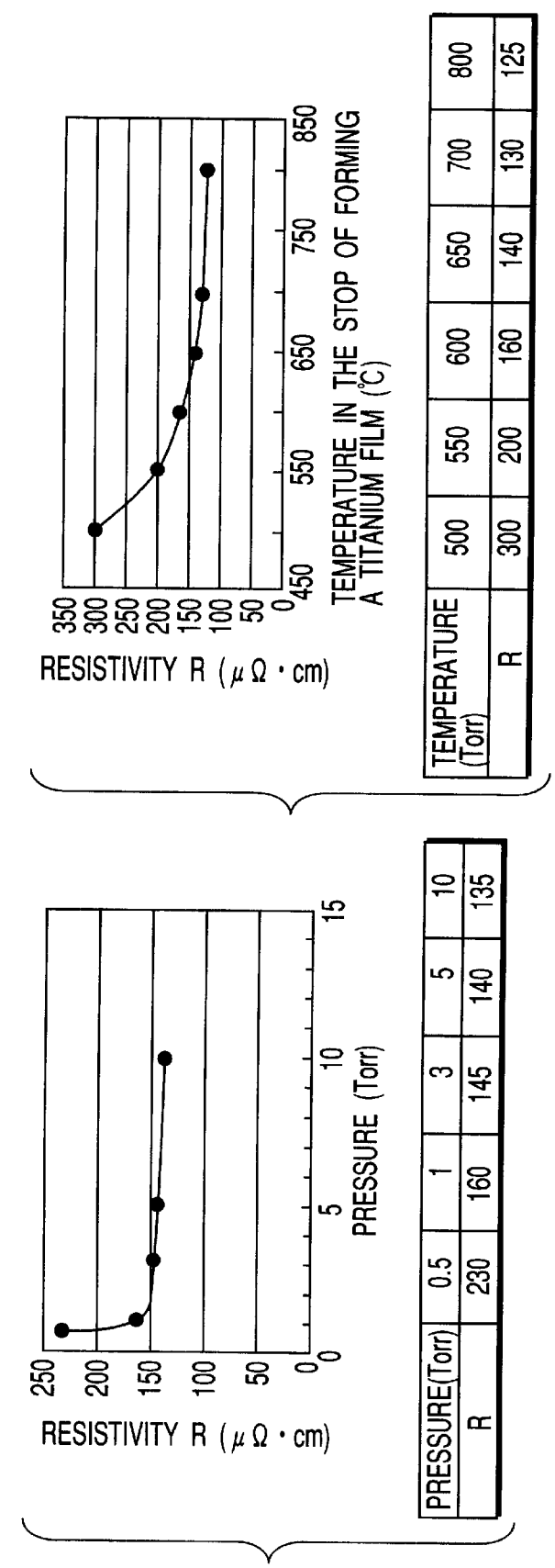
FIG. 8 is a diagram showing a change in resistivity relative to the pressure in nitriding time.
FIG. 9 is a diagram showing a change in resistivity relative to the film forming temperature.

FIG. 8 is a diagram showing a change in resistivity relative to the pressure in nitriding time. The data shown in the diagram were obtained from the experiments under the following conditions: the temperature of wafer is 600° C., the supply rate of $H_2$ gas is 1500 sccm, the supply rate of $N_2$ gas is 500 sccm, and the nitriding time is 30 seconds.

As shown in FIG. 8, in the case where the pressure in the nitriding time is 0.5 to 10 Torr, the rate of nitriding the surface of the titanium film is increased and the resistivity is considerably reduced.

FIG. 9 is a diagram showing a change in resistivity relative to the temperature in the step of forming a titanium film. The data shown in the diagram were obtained from the experiments under the following conditions: the process pressure is 1 Torr, the supply rate of $H_2$ gas is 1500 sccm, the supply rate of $N_2$ gas is 500 sccm, and the nitriding time is 30 seconds. As shown in FIG. 9, in the case where the temperature in the step of forming the titanium film is 550° C. or higher, the resistivity is considerably reduced.

Figure 10:
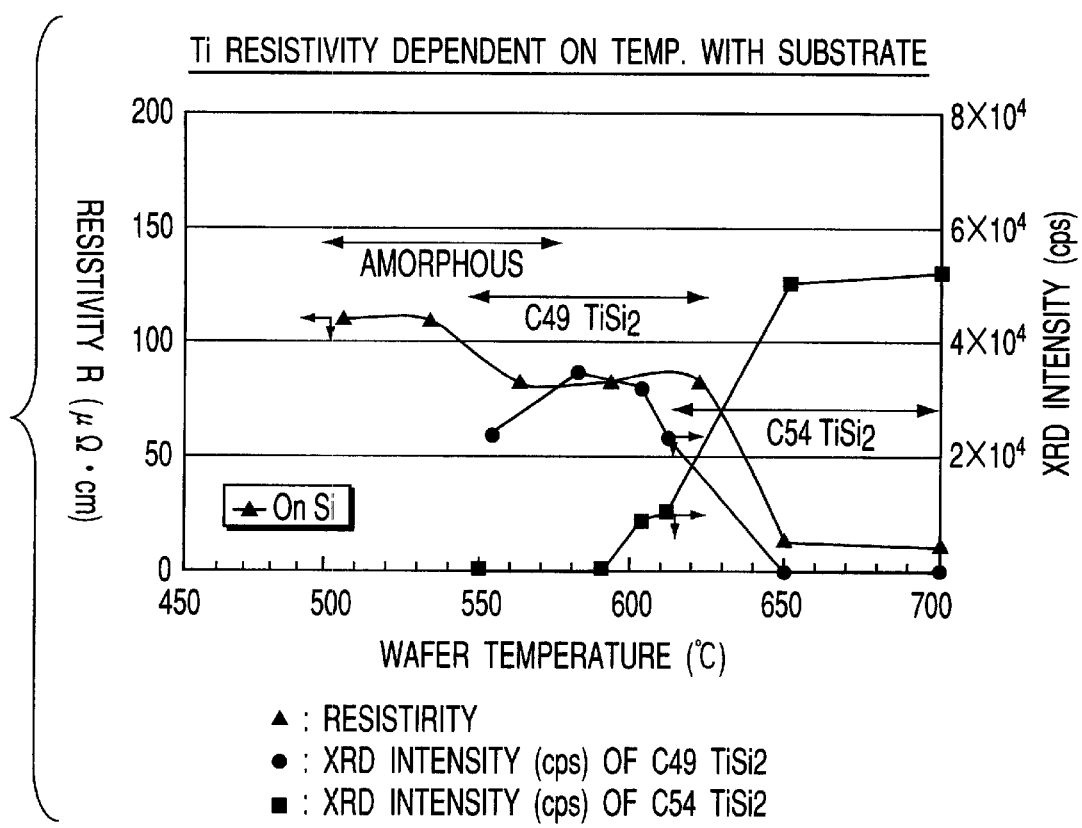
FIG. 10 is a diagram showing changes in resistivity and XRD Intensity (CPS) relative to the temperature of a wafer.

FIG. 10 shows changes in resistivity and XRD Intensity (CPS) relative to the temperature in the step of forming the titanium film. In FIG. 10, the symbol ▼ represents a value of resistivity, and the symbols ● and ■ represent values of XRD Intensity (CPS) of $C49TiSi_2$ and $C54TiSi_2$, respectively.

In the step of forming the titanium film, a first process gas containing therein $TiCl_4$ and a reducing gas ($H_2$ gas was used) is used to form a titanium film on the surface of the substrate (Si). The titanium film formed in this step is a TiSi film.

The above data demonstrate the following matters. When a titanium film is formed at a low temperature, the titanium film is amorphous. Formation of high-resistance $C49TiSi_2$ is started at about 550° C. Formation of low-resistance $C54TiSi_2$ is started at about 580° C.

Based on the above data, it is understood that, when a titanium film is formed at, for example, 580° C., the high-resistance $C49TiSi_2$ is formed dominantly. However, thereafter, the low-resistance Ti film can be obtained by decreasing Cl from the titanium film or the surface thereof at a temperature higher than the Ti film forming temperature, and simultaneously nitriding the surface of the titanium film.

As described above, since in the present invention, the semiconductor substrate is not subjected to the atmosphere at all in the middle of the process of forming continuously the titanium film and the titanium nitride film, the inconvenience can be avoided that the surface of the semiconductor substrate is oxidized, and so forth.

While the titanium film is formed by utilizing the CVD method in the above-mentioned embodiment, the present invention is not limited thereto. For example, the titanium film may be formed by utilizing the PVD method.

While filling of the contact hole has been described as an example, it is to be understood that the present invention may also be applied to filling of the via hole.

As set forth hereinabove, according to the method, of the present invention, of forming a titanium film and a barrier film on a surface of a substrate by lamination, the process of nitriding a surface layer of a titanium film to form thereon a nitride layer is carried out under the presence of both $N_2$ gas and $H_2$ gas, whereby the contamination of the substrate due to the by-product produced in the process of forming the titanium film can be suppressed and the high yield can be maintained and also it is possible to reduce greatly the contact resistance of the titanium film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a titanium film and a barrier film on a surface of a substrate by lamination, the method comprising:

forming the titanium film by CVD on the surface of the substrate using a first process gas containing therein $TiCl_4$ and a reducing gas;

forming plasma above a surface of the titanium film formed on the surface of the substrate using a second process gas containing therein $N_2$ gas and $H_2$ gas;

decreasing Cl in the titanium film by decreasing $TiCl_x$ where x=2 to 3, remaining in the titanium film and on the surface thereof by the $H_2$ gas in the plasma, and simultaneously nitriding the surface of the titanium film by $N_2$ gas in the plasma; and forming the barrier film on the nitrided titanium film, the second process gas containing $N_2$ gas in a ratio of 0.5 or lower with respect to the $H_2$ gas.

2. A method according to claim 1, wherein the reducing gas of the first process gas is at least one of $SiH_4$ gas and $H_2$ gas.

3. A method according to claim 1, wherein nitriding the titanium film is carried out at a pressure higher than that of forming the titanium film on the surface of the substrate.

4. A method according to claim 3, wherein nitriding the titanium film is carried out at a temperature higher than that of forming the titanium film on the surface of the substrate.

5. A method according to claim 1, wherein the barrier film is a TiN film.

6. A method according to claim 1, wherein simultaneously nitriding the surface of the titanium film is carried out under the conditions of an $H_2$ gas supply rate of 500 to 3000 sccm, an $N_2$ gas supply rate of 300 to 1000 sccm, a nitriding temperature of 550 to 800° C., and a nitriding pressure of 0.5 to 10 Torr.

7. A method according to claim 1, wherein nitriding the surface of the titanium film is carried out continuously after forming the titanium film in a same processing chamber.

8. A method according to claim 7, wherein, in nitriding the surface of the titanium film, the by-product $TiCl_x$ that adheres to an inner wall of the processing chamber, where x=2 to 3, is changed into a stable nitride produced by reducing by $H_2$ gas and nitriding by $N_2$ gas in the plasma.

9. A method according to claim 1, wherein nitriding the surface of the titanium film is carried out for reducing electric resistance of the titanium film.

10. A method according to claim 1, wherein forming the titanium film is carried out at a substrate temperature of 550° C.

11. A method for forming a titanium film and a barrier film on a surface of a substrate by lamination, the method comprising:

forming the titanium film by CVD on the surface of the substrate by using a first process gas containing a $TiCl_4$ gas and a reducing gas;

forming titanium silicide by making silicon in the substrate react with titanium in the substrate simultaneously with the formation of the titanium film on the substrate;

forming plasma by using a second process gas containing a nitrogen gas and $H_2$ gas;

decreasing Cl in the titanium film by reducing $TiCl_x$, where x=2 to 3, in the titanium film by using the $H_2$ gas in the plasma while simultaneously nitriding a surface of the titanium film by using the nitrogen gas in the plasma; and forming a barrier film on the nitrided surface of the titanium film, the second process gas containing $N_2$ gas in a ratio of 0.5 or lower with respect to the $H_2$ gas.

12. A method according to claim 11, wherein forming a titanium film, forming the titanium silicide, and nitriding the titanium film are carried out at a temperature of 550° C. or higher.

13. A method according to claim 12, wherein forming the titanium film, forming titanium silicide and nitriding the titanium film are carried out at a substrate temperature of 580° C. or higher.

14. A method according to claim 13, wherein the crystal structure of titanium silicide formed in forming the titanium silicide contains C54.

15. A method according to claim 11, wherein the reducing gas in the first process gas is at least one of $H_2$ gas and $SiH_4$ gas.

16. A method according to claim 11, wherein the barrier film is a TiN film.

17. A method according to claim 11, wherein nitriding the surface of the titanium film is carried out continuously after forming the titanium film in a same processing chamber.

18. A method according to claim 17, wherein the by-product $TiCl_x$ that adheres to an inner wall of the processing chamber, wherein x=2 to 3, is reduced by $H_2$ gas in the plasma, and simultaneously the titanium film is nitrided by $N_2$ gas in the plasma, forming a stable nitride.

19. A method according to claim 11, wherein nitriding the titanium film is carried out for reducing electric resistance of the titanium film.

20. A method according to claim 11, wherein simultaneously nitriding the titanium film is performed under conditions of an $H_2$ gas supply rate of 500 to 3000 sccm, an $N_2$ gas supply rate of 300 to 1000 sccm, a nitriding temperature of 550 to 800° C., and a nitriding pressure of 0.5 to 10 Torr.

* * * * *